(12) United States Patent
Linke (10) Patent No.: US 7,855,336 B2
(45) Date of Patent: Dec. 21, 2010

(54) CONCENTRATED SOLAR PHOTOVOLTAIC MODULE WITH PROTECTIVE LIGHT SHIELDING

(75) Inventor: Edward J. Linke, Milford, CT (US)

(73) Assignee: Opel, Inc., Shelton, CT (US)

( * ) Notice: Subject to any disclaimer, the term of this patent is extended or adjusted under 35 U.S.C. 154(b) by 0 days.

(21) Appl. No.: 12/433,719

(22) Filed: Apr. 30, 2009

(65) Prior Publication Data

US 2009/0260674 A1 Oct. 22, 2009

Related U.S. Application Data

(63) Continuation-in-part of application No. 11/928,154, filed on Oct. 30, 2007.

(51) Int. Cl.
*H02N 6/00* (2006.01)
*H01L 31/00* (2006.01)
*H01L 31/042* (2006.01)

(52) U.S. Cl. .......... 136/246; 136/251; 136/259

(58) Field of Classification Search ......... 136/243–244, 136/246, 251, 259
See application file for complete search history.

(56) References Cited

U.S. PATENT DOCUMENTS

| 4,045,246 | A | | 8/1977 | Mlavsky et al. |
| 4,143,641 | A | * | 3/1979 | Christopher ............... 126/707 |
| 4,383,891 | A | * | 5/1983 | Clavier ..................... 202/234 |
| 4,511,755 | A | | 4/1985 | Mori |
| 4,830,678 | A | | 5/1989 | Todorof et al. |
| 5,118,361 | A | | 6/1992 | Fraas et al. |
| 5,460,659 | A | | 10/1995 | Krut |
| 5,460,660 | A | * | 10/1995 | Albright et al. ............ 136/251 |
| 5,505,789 | A | | 4/1996 | Fraas et al. |
| 5,714,012 | A | * | 2/1998 | Murata et al. ............... 136/247 |
| 5,990,415 | A | | 11/1999 | Green et al. |
| 6,020,554 | A | * | 2/2000 | Kaminar et al. ............ 136/246 |
| 6,365,824 | B1 | * | 4/2002 | Nakazima et al. .......... 136/251 |
| 6,399,874 | B1 | | 6/2002 | Olah |
| 6,483,093 | B1 | | 11/2002 | Takemura et al. |

(Continued)

FOREIGN PATENT DOCUMENTS

WO WO2006/114457 11/2006

OTHER PUBLICATIONS

Long-Term Reliability Concerns Resolved by Third Generation Integrated High-Concentration PV Systems, V. Garboushian et al.

(Continued)

*Primary Examiner*—Basia Ridley
*Assistant Examiner*—Lindsey Bernier
(74) *Attorney, Agent, or Firm*—Gordon & Jacobson, PC (57) ABSTRACT

A solar photovoltaic module including a base member supporting an array of photocells as well as corresponding concentrating lenses and light guides. At least one opaque light shield defines cutouts corresponding to the light guides. The at least one opaque light shield is positioned above the base member and operates to block light incident thereon from reaching portions of the base member. The at least one light shield can be installed with a convex shape that directs condensation away from the cutouts and preferably functions as part of guide channels that guide condensation toward one or more vented hydrophilic members (e.g., sponges and the like), which are preferably disposed at one or both ends of the module.

5 Claims, 9 Drawing Sheets

U.S. PATENT DOCUMENTS

| | | |
|---|---|---|
| 6,653,551 B2 | 11/2003 | Chen |
| 6,717,045 B2 | 4/2004 | Chen |
| 2002/0148497 A1* | 10/2002 | Sasaoka et al. ............. 136/243 |
| 2004/0216734 A1 | 11/2004 | Lawheed |
| 2007/0227583 A1* | 10/2007 | Davies et al. ............... 136/251 |
| 2007/0289622 A1* | 12/2007 | Hecht ......................... 136/246 |
| 2008/0087323 A1* | 4/2008 | Araki et al. ................. 136/256 |
| 2009/0107541 A1* | 4/2009 | Linke et al. ................. 136/246 |

OTHER PUBLICATIONS

Photovoltaic Specialists Conference, 1997, Conference Record of the Twenty-Sixth IEEE.

Nonimaging Fresnel Lens Concentrator—The Prototype, Ralf Leutz, Akio Suzuki, Atsushi Akisawa and Takao Kasiwagi, May 1999.

Sol3G HCPV Systems Technical Report, Ricard Pardell, Dec. 6, 2007, 35 pages.

* cited by examiner

FIG.11

CONCENTRATED SOLAR PHOTOVOLTAIC MODULE WITH PROTECTIVE LIGHT SHIELDING

CROSS-REFERENCE TO RELATED APPLICATION

This application is a continuation-in-part of U.S. Ser. No. 11/928,154, filed Oct. 30, 2007, the contents of which are hereby incorporated herein by reference.

BACKGROUND OF THE INVENTION

1. Field of the Invention

This invention relates generally to the field of photovoltaic systems. More particularly, this invention relates to concentrated solar photovoltaic systems and parts thereof.

2. State of the Art

Terrestrial solar photovoltaic systems convert solar insolation into electrical energy using photovoltaic cells. The amount of electrical energy that a photovoltaic cell produces is proportional to the intensity of the insolation it receives and the surface area of the cell. Photovoltaic cells are typically made from either silicon or gallium arsenide. Silicon photocells are less efficient at converting solar insolation to electrical energy, and thus require a larger size and a greater number of cells to provide a required amount of electrical output. Gallium arsenide (GaAs) photovoltaic cells, by contrast, are more efficient at converting insolation to electrical energy, and thus require less surface area to achieve the same electrical output as their silicon counterparts, but are more expensive to manufacture.

Concentrating the insolation received by the GaAs photocell can effectively decrease costs by increasing the electrical output of the GaAs photocell. Typically, such concentration is realized by a large concentrator lens and a secondary optical element that cooperate to channel insolation to the GaAs photovoltaic cell. These components must be manufactured and assembled with tight tolerances in order to properly channel sunlight to the GaAs photocell.

The array of photocells typically heats up as the photocells absorb solar insolation and convert it to electrical energy. Moreover, despite the tight tolerances used in creating and assembling the components of the module, the concentrated light from the concentrator lenses can miss the secondary optical element (for example, when the module is not aligned to the incident angle of the solar insolation) and strike the base of the module which supports the photocells. This concentrated light can burn or otherwise damage the wiring of the photocell array and result in electrical shorts or other unwanted failures. In addition, condensation can form on the inside of the large concentrator lens of the module when the ambient temperature decreases (which typically occurs at night). Such condensation can drip down to the base of the module, collect there, and cause electrical shorts in the wiring of the photocell array during operation thereof. Moreover, given the high specific heat content of water, condensation at the base may also cause undesirable heating of the photocells and limit convection of heat away from the photocells during operation.

SUMMARY OF THE INVENTION

The present invention is directed to a solar photovoltaic module to be used for the generation of power suitable for terrestrial applications, including power grid fields, rooftop systems, private or public utilities, and commercial and residential building applications. The solar voltaic module includes a base member, two side panels detachably connected to the base member, a top panel detachably connected to the side panels, and two end panels detachably connected to the base member and/or the side panels. The top panel contains an integral array of concentrating lenses that focus solar energy through the interior of the module to an array of photocells via corresponding secondary optical elements mounted within the module.

The base member of the module mechanically supports the array of photocells (and corresponding secondary optical elements) as well as electrical conductors that electrically couple the photocells to external terminals. The concentrating lenses, secondary optical elements, and photocells of the module cooperate to convert solar radiation incident on the concentrating lens to electrical energy for output at the terminals of the module.

At least one light shield extends between the side panels of the module about the secondary optical elements. The at least one light shield is opaque and preferably reflective with respect to incident solar insolation and thus operates to block the incident solar insolation from reaching portions of the base member adjacent the photocells. The opaque light shield blocks incident concentrated light that can burn or otherwise damage the electrical conductors that are coupled to the photocells of the module and result in electrical shorts or other unwanted failures.

In the preferred embodiment, the base member includes a generally planar support surface having one or more recesses which receive the photocells. A plurality of cooling fins extend downward opposite the support surface along the length of the base member. The cooling fins dissipate heat away from the photocells. The base member also has two side walls that angularly extend from opposite edges of the support surface, and two shoulders extending from the bottom of the side walls to further assist with supporting the side panels of the module. The side walls of the base member project upward from opposite edges of the support surface at obtuse angles, preferably in a range between sixty to seventy-five degrees, and most preferably, between sixty-three to seventy degrees. The shoulders preferably attach at right angles to the side walls, which creates a support surface perpendicular to the bottom of the side panels as the side panels are mounted parallel to exterior surfaces of the side walls. The side panels are mounted to the side walls by a plurality of self tapping screws or other fasteners that pass through holes or slots in the side panels and fasten the side panels to the side walls. The side walls preferably include a rib which defines a channel accessible for receiving the screws or other fasteners.

The top panel is attached to and supported by the side panels, and is mounted substantially parallel to the support surface such that the concentrating lenses are parallel with the support surface. End panels are mounted to respective ends of the base member, perpendicular to the direction of the array of photocells. The array of photocells, secondary optical elements, and light shields are thus enclosed by the base member, side panels, top panel, and end panels. Sealing adhesives are applied to portions of the enclosed housing to help minimize water, dust, and other particles.

The concentrating lenses in the top panel are preferably Fresnel lenses, but are not limited thereto. The concentrating lenses receive solar radiation over a large surface area and channel it into a smaller area at the top of the secondary optical element. The array of secondary optical elements homogenize and mix the light received from the Fresnel lenses and focus it onto the corresponding array of photocells. The secondary optical element is preferably a prism having the shape of an inverted pyramid with an entry aperture greater than that of a corresponding photocell. The Fresnel lenses are designed to channel insolation at predetermined angles over a set distance, which, in conjunction with the secondary optical elements, focus insolation onto the photocells' smaller surface areas at a much greater intensity.

Inside the module, the secondary optical elements are secured and aligned above respective photocells between the respective photocells and respective concentrating lenses, preferably by adhesive bonds between the bottom surfaces of the secondary optical elements and the top surfaces of the photocells.

The at least one opaque light shield defines cut-out regions sized to receive the top surfaces of the secondary optical elements without touching the secondary optical elements. The at least one opaque light shield is preferably secured by the sidewalls of the base above the support surface of the base by a plurality of teeth protruding from an interior surface of the sidewalls. The teeth are configured to grip opposite sides of the light shields in an interference or snap fit. The at least one opaque light shield may be inserted into position between the sidewalls in a flat configuration and then bent upward into a convex shape or downward into a concave shape. Alternatively, the at least one light shield may be inserted into position with pre-formed convex or concave shapes. The at least one light shield installed with a convex shape functions not only to block light incident thereon, but also to cooperate with the sidewalls to define guide channels for condensation collected thereon. These guide channels guide the condensation toward one or more vented hydrophilic members (e.g., sponges and the like), which are preferably disposed at one or both ends of the module.

The photovoltaic module is assembled by bonding the array of photocells to the base member, wiring electrical conductors between the photocells and the terminals of the module in a desired configuration, and assembling the housing. The photovoltaic module provides a new mounting structure that supports the photocells, secondary optical elements, and light shields of the module, helps prevent shorts in the wiring of the photocell arrays, reduces heating of the photocells, and collects and guides condensation away from the photocells and electrical conductors of the module and toward one or more vented hydrophilic members preferably disposed at one or both ends of the module.

DETAILED DESCRIPTION OF THE PREFERRED EMBODIMENTS

As used in the present application, the following terms have defined meanings:

"Visible radiation" or "light" means electromagnetic radiation having a wavelength from 380 nanometers to 750 nanometers.

"Transparent" and "clear" is a property of a medium and means that the medium allows for transmission of incident visible radiation or light therethrough.

"Opaque" is a property of a medium and means that the medium allows for very little transmission of incident visible radiation or light therethrough. An opaque medium reflects, scatters, or absorbs most of the visible radiation incident thereon.

Referring to FIGS. 1-5, a concentrated solar photovoltaic module 10 of the present invention includes a base member 12 which has a generally planar support surface 14. The support surface 14 contains one or more recesses 16 (FIG. 2) shaped to receive an array of GaAs photocells 18 that are mounted therein, preferably by double-sided thermally conductive tape. The GaAs photocell is a device that converts light energy into electrical energy. Fundamentally, the device fulfills two functions: photogeneration of charge carriers (electrons and holes) in a GaAs light-absorbing material, and separation of the charge carriers to contacts that will transmit the electricity (simply put, carrying electrons and holes for output to conductors). The GaAs photocell is typically realized by a photovoltaic integrated circuit together with a bypass diode and electrical interconnections mounted on a substrate. Other configurations can be used. The electrical outputs of the photocells 18 are electronically connected to the output terminals of the module in a desired configuration (typically in a series or parallel configuration) by electrical conductors (not shown) supported by the base member 12. A plurality of cooling fins 20 extend down from the base member 12 opposite the support surface 14 along the length of the photovoltaic module 10. The cooling fins 20 are open to the atmosphere, and heat is therefore dissipated via convection. The cooling fins 20 are preferably integrally formed with the base member 12, but can also be separately formed and attached thereto by mechanical fasteners (e.g., bolts) and/or chemical adhesives. The photocells 18, which convert solar insolation (sunlight) into electrical energy, can also employ other types of photovoltaic cells, such as silicon photovoltaic cells, amorphous silicon photovoltaic cells, polycrystalline photovoltaic cells, micro-crystalline photovoltaic cells, photoelectrochemical cells, nanocrystal photovolatic cells, and others. The base member 12 is preferably made by the extrusion of a thermally conductive material such as aluminum, but is not limited to thermally conductive materials.

Figure 1:
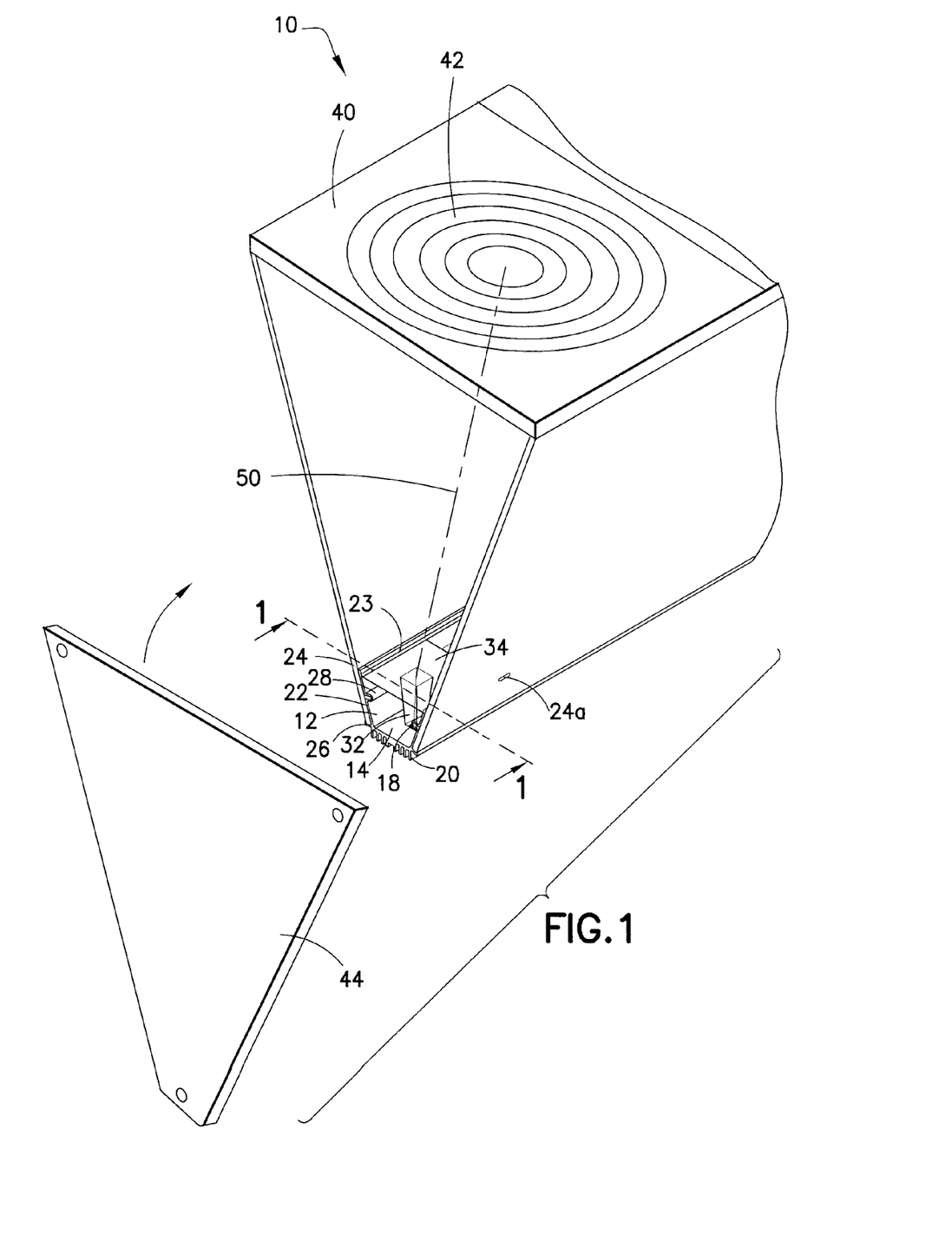
FIG. 1 is a partial-broken, partially exploded front perspective view of the concentrated solar photovoltaic module of the present invention.

The base member 12 also includes two side walls 22 that angularly extend upward from opposite edges of the support surface 14 for mechanically supporting a plurality of side panels 24. The side panels 24 mount parallel to the side walls 22. Two shoulders 26, are integrally formed and extend from the bottom of the side walls 22 to further assist with supporting the side panels 24. In one embodiment, the side walls 22 project upward from opposite edges of the support surface 14 at obtuse angles, preferably in a range between sixty and ninety degrees, and most preferably between sixty-three and seventy degrees. The shoulders 26 preferably project from the side walls 22 at right angles, which provides a support area 26a (FIG. 2) perpendicular to the bottom of the side panel 24 as it is mounted parallel to the side wall 22 as further discussed below.

Figure 3:
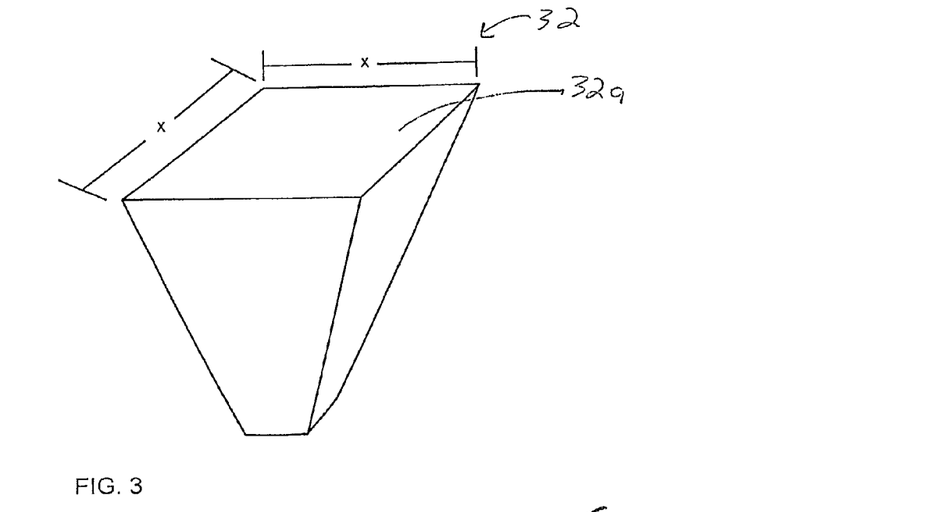
FIG. 3 is a perspective view of the secondary optical element of FIG. 1.

The base member 12 supports an array of secondary optical elements 32 that are mounted atop corresponding photocells 18 via a plurality of adhesive bonds 32b. The secondary optical element 32, best shown in FIG. 3, homogenizes and mixes light received at its top portion 32a, and projects it onto a given photocell 18. The secondary optical element 32 is preferably a prism shaped as an inverted pyramid. As shown in FIG. 3, the top portion 32a of the secondary optical element 32 has a square shape with sides of dimension 'x'. The top portion 32a is preferably approximately four times the size of the top surface of the photocell 18. The prism 32 is durable, thermally stable, and easily manufactured to desired tolerances.

Figure 4:
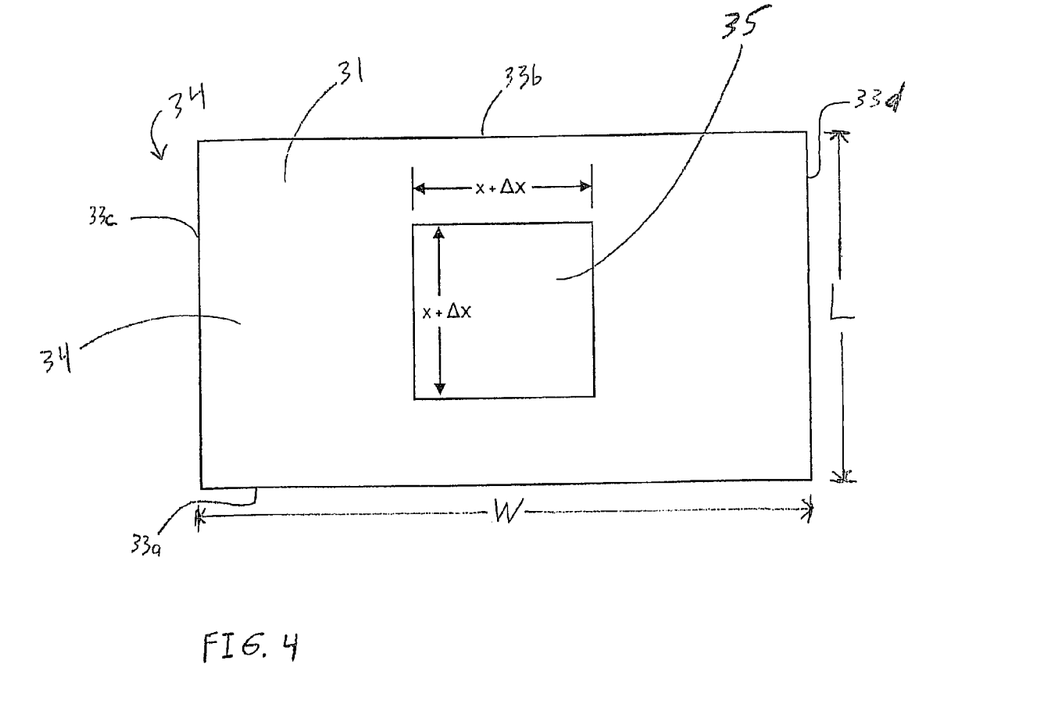
FIG. 4 is a top view of the light shield of FIG. 1.

A light shield 34, best shown in FIG. 4, is provided for each secondary optical element 32. The light shield 34 is opaque with respect to incident solar insolation and thus operates to block the incident solar insolation from reaching portions of the base member 12 adjacent the photocells 18. In other embodiments, other portions of the light shield, such as the entire structure, an intermediate layer or bottom layer can be opaque in nature in order to block the incident solar insolation from reaching portions of the base member 12 adjacent the photocells 18.

More particularly, the opaque light shield 34 blocks concentrated off-axis light 39 (FIG. 2) incident thereon from reaching the support surface 14 of the base 12. Instead, such off-axis light 39 is reflected, scattered or absorbed by the opaque light shield 34. The light shield 34 extends along a length 'L' from a first side 33a to a second side 33b, and along a width W from a third side 33c to a fourth side 33d. As shown in FIG. 4, the light shield 34 may be initially provided in a flat configuration with a centrally located cut-out region 35. The cut-out region 35 is preferably in the shape of a square having sides of dimension 'x'+'Δx', though other shapes may be used (e.g., while the secondary optical element 32 is preferably a prism in the shape of an inverted pyramid with a square top surface 32a, other shapes could be used, and the cut-out 35 could be shaped accordingly).

Figure 2:
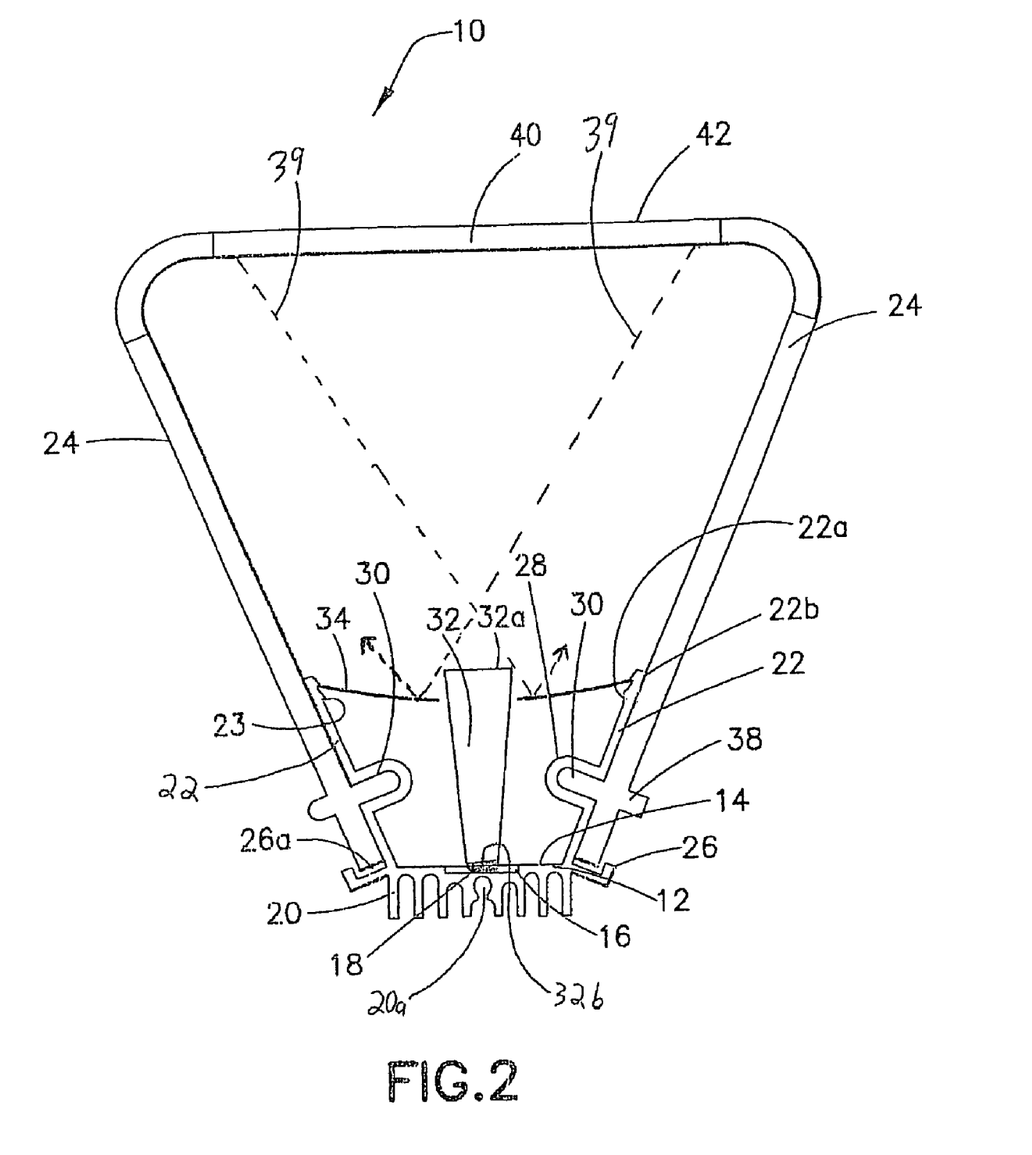
FIG. 2 is a section view of the photovoltaic module of FIG. 1 along the line 1-1.
Figure 5:
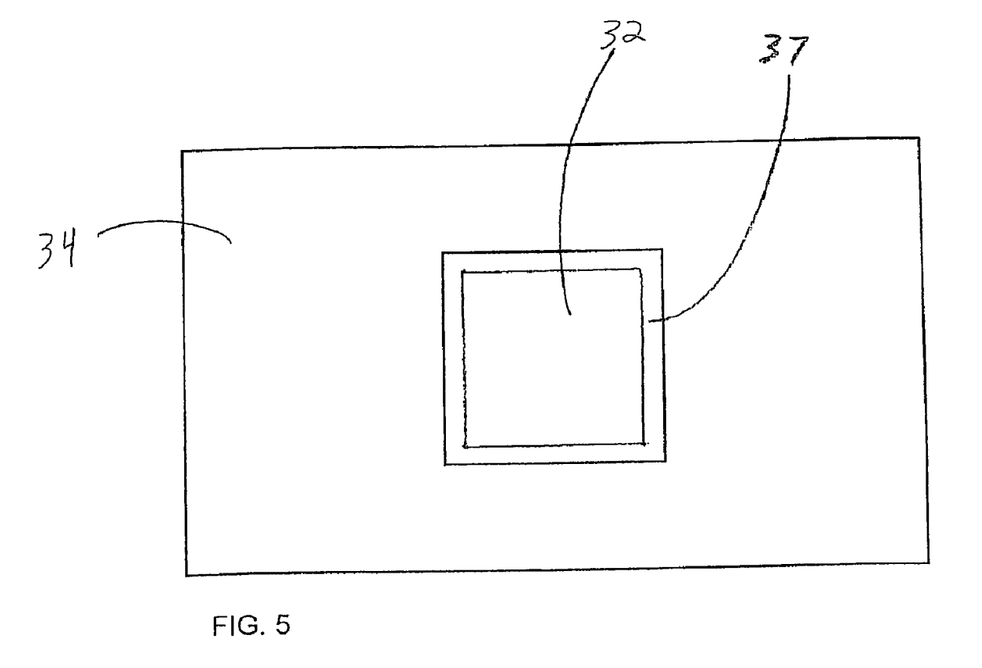
FIG. 5 is a top view of the secondary optical element and lightshield.

The cut-out region 35 is preferably sized to receive the top portion 32a of a respective secondary optical element 32 such that the top portion 32a will pass through the cut-out 35 as the light shield 34 is placed over the secondary optical element 32. As shown in FIGS. 1-2, the light shield 34 extends between the sidewalls 22 about the secondary optical elements 32, preferably without touching the secondary optical element 32. The interior edges of the cut-out 35 and the outer surface of the secondary optical element 32 thus preferably define an air gap 37 (FIGS. 2, 5). The air gap 37 prevents heat from being conducted from the light shield 34 to the secondary optical element 32 and photocells 18. The air gap 37 also prevents the light shield 34 from disrupting light projection through the secondary optical element 32. It will be appreciated that the size of the air gap 37 will vary based on the value of 'Δx', the extent to which the light shield 34 is bent upon installation (further discussed below), the shape of the secondary optical element 32, and the height of the light shield 34 relative to the top portion 32a of the secondary optical element 32 (further discussed below).

The light shield 34 is mechanically attached to and supported by the interior sides 22a (FIG. 2) of the side walls 22 of the base member 12. The side walls 22 contain a plurality of teeth 23 projecting from the interior sides 22a. These teeth 23 interface to the sides 33c, 33d of the light shield 34. As the light shield 34 is pushed down between the side walls 22 over the secondary optical element 32, the top portion 32a of the secondary optical element passes through the cut-out 35 of the light shield 34 as the sides 33c, 33d of the light shield 34 are snapped into place under the teeth 23.

The light shield 34 is preferably realized by a thin flexible plate of metal, though other materials may be used. The preferred material of the light shield 34 is polished aluminum with a protective film and/or a reflective coating to reflect light incident thereon and to prevent corrosion over time. Alternatively, light shield 34 may be made from black anodized aluminum to absorb light incident thereon. It will be appreciated that other materials may be used, such as, for example plastic with a metal coating or semi-reflective polish and/or opaque materials, and that the light shield 34 may be completely absorbent, reflective, or both absorbent and reflective depending on the materials used.

In the preferred embodiment, the width W of the light shield 34 is slightly larger than the distance between opposing teeth 23 on respective opposing side walls 22. Prior to installation, the light shield may have a flat configuration. As the light shield 34 is pushed downward, it bends into a concave shape relative to the support surface 14 as the sides 33c, 33d curve in an upward direction underneath the opposing teeth 23. The teeth 23 preferably project in a downward direction such that the opposing sides 33c, 33d of the light shield 34 snap into gaps defined by adjacent teeth on the opposing side walls 22. The downward angle of the teeth 23 prevents the light shield 34 from deflecting back to its pre-installed flat shape, and thus aids in fixing the light shield 34 in place. Alternatively, the light shield 34 may be inserted into position with a pre-formed concave or convex shape. It will be appreciated that the teeth 23 may be located at different heights along the side walls 22 relative to the support surface 14, and that the light shield 34 may therefore be snapped into place at different heights depending on its width W and the extent to which it is bent. As the sidewalls 22 angle downward towards the support surface 14, a light shield 34 of a given width W will experience a tighter and tighter fit as it is pushed downward because the distance between the sidewalls 22 decreases in that direction. This allows for greater manufacturing tolerances of the outer dimensions W×L of the light shield 34.

The light shields 34 of the module are preferably installed to overlap each other along the length of the module 10 rather than simply lying adjacent to each other. This ensures that they provide continuous coverage along the length of the module 10. Moreover, it is preferred that the light shields overlap one another in an alternating manner (over-under-over-under, etc.) over the length of the module 10 in order to maintain a relatively constant height of the light shields 34 over the length of the module 10 (e.g., to mount all of the light shields 34 within teeth 23 situated at the same height).

It will be appreciated that in the installed configuration of FIGS. 1-2, the opaque light shields 34 will block light 39 incident thereon from reaching the support surface 14 of the base 12, which could burn or otherwise damage the electrical conductors that are coupled to the photocells of the module and result in electrical shorts or other unwanted failures.

It will also be appreciated that the cut-out 35 of a given light shield 34 may be formed with smaller dimensions than that of the top portion 32a of the corresponding secondary optical element 32. In such embodiments, the light shield 34 is installed first, and the bottom of the secondary optical element 32 is then passed through the cutout portion 35 of the light shield 34 and bonded to a respective photocell 18 via an adhesive bond 32b. It is preferred however, that in the installed position, the light shield 34 is offset from both the support surface 14 and the top portion 32a of the secondary optical element 32 and does not touch any portion of the periphery of the secondary optical element 32. Such positioning helps to ensure the blocking of off-axis light 39 and prevents the light shield 34 from transferring heat to the photocells 18 via the secondary optical element 32.

Turning now to the outer components of the module 10, the side panels 24 may be mounted to the side walls 22 at different heights depending on the distance desired between the top panel 40 and the support surface 14. At the lowest height allowed, the bottom of the side panels 24 would be supported by the support area 26a of the shoulders 26. In the preferred embodiment, the side walls 22 include a rib 28 defining a channel 30 (FIG. 2) accessible for receiving self tapping screws or other fasteners for mounting the side panels 24 parallel to the side walls 22.

The side panels 24 are mounted to an exterior surface 22b of the side walls 22 and parallel to the side walls 22. A plurality of self tapping screws 38 or other fasteners pass through holes or slots 24a (FIG. 1) in the side panels 24 and into the channels 30. Alternatively, holes may be drilled directly into the side walls 22 and screws may be used to secure the side panels 24. The self tapping screws 38 (FIG. 2) may be loosened or removed, the side panels 24 slid along the length of the side walls 22, and the self tapping screws 38 reinserted through the holes of the side panels 24 and into the side walls 22. The top panel 40, which contains an integral array of concentrating lenses 42, is attached and mounted to the side panels 24. The top panel 40 can be formed by bonding or mechanically fastening a number of lenses 42 together or by molding the lenses 42 together with as an integral lens array. The lens assembly is then secured by a support assembly (e.g., two side supports and two end supports) and sealed with a compound to provide both mechanical fastening and water tight sealing. The top panel 40 is then fastened to the side panels 24 with a plurality of self tapping screws or other fasteners, which are inserted through slots or holes in the top panel 40.

The fixation of the side panels 24 to the side walls 22 of the base member 12 through the use of the slots 24a, self tapping screws, or other equivalent means allows the height of the side panels 24, and thus the top panel 40, to be adjusted relative to the base member 12. The distance between the concentrating lenses 42 in the top panel 40 and the secondary optical element 32 and photocells 18 may therefore be varied as desired, and the focal point of the concentrating lenses 42 may be moved to ensure that the concentrating lenses 42 are focused to a desired part of the secondary optical element 32.

The preferred configuration arranges the concentrating lenses 42 parallel to the corresponding array of photocells 18. The concentrating lenses 42 are preferably Fresnel lenses, but can include other lenses known in the art that concentrate light (insolation) and focus it on a smaller surface area. The concentrating lenses 42 cooperate with the secondary optical elements 32 and photocells 18 to convert insolation incident on the concentrating lenses 42 to electrical energy for output. The concentrating lenses 42 receive the insolation over a large surface area and channel it onto a smaller area at the top of the secondary optical element 32. The array of secondary optical elements 32 homogenize and mix the light received from the concentrating lenses 42 and focus it onto the corresponding photocells 18 smaller surface area at a much greater intensity.

In order to help prevent exposure of the interior of the module 10 to the elements, two end panels 44 (FIG. 1) are provided. The end panels 44 attach to the base member 12 at opposite ends. Two of the cooling fins 20 are formed to together define a channel 20a (FIG. 2) for receiving a self tapping screw. The end panels 44 are mounted to the ends of the module 10 at the base 12 by self tapping screws passing through the end panels 44 and into the channel 20a of the base 12 and/or into the outer edges of the side panels 24 and top panel 40. The array of photocells and secondary optical elements are thus enclosed by the base member, side panels, top panel, and end panels. Sealing adhesives are applied to the enclosed housing to help keep out water, dust, or other particles. The module 10 may also contain a valve (not shown) that regulates air pressure inside the module 10 in accordance with the atmospheric pressure, which varies as the ambient temperature changes. This valve may adjust the pressure without allowing water, dust, or other contaminants inside the module 10, and may also vent the module 10 as desired.

Figure 6:
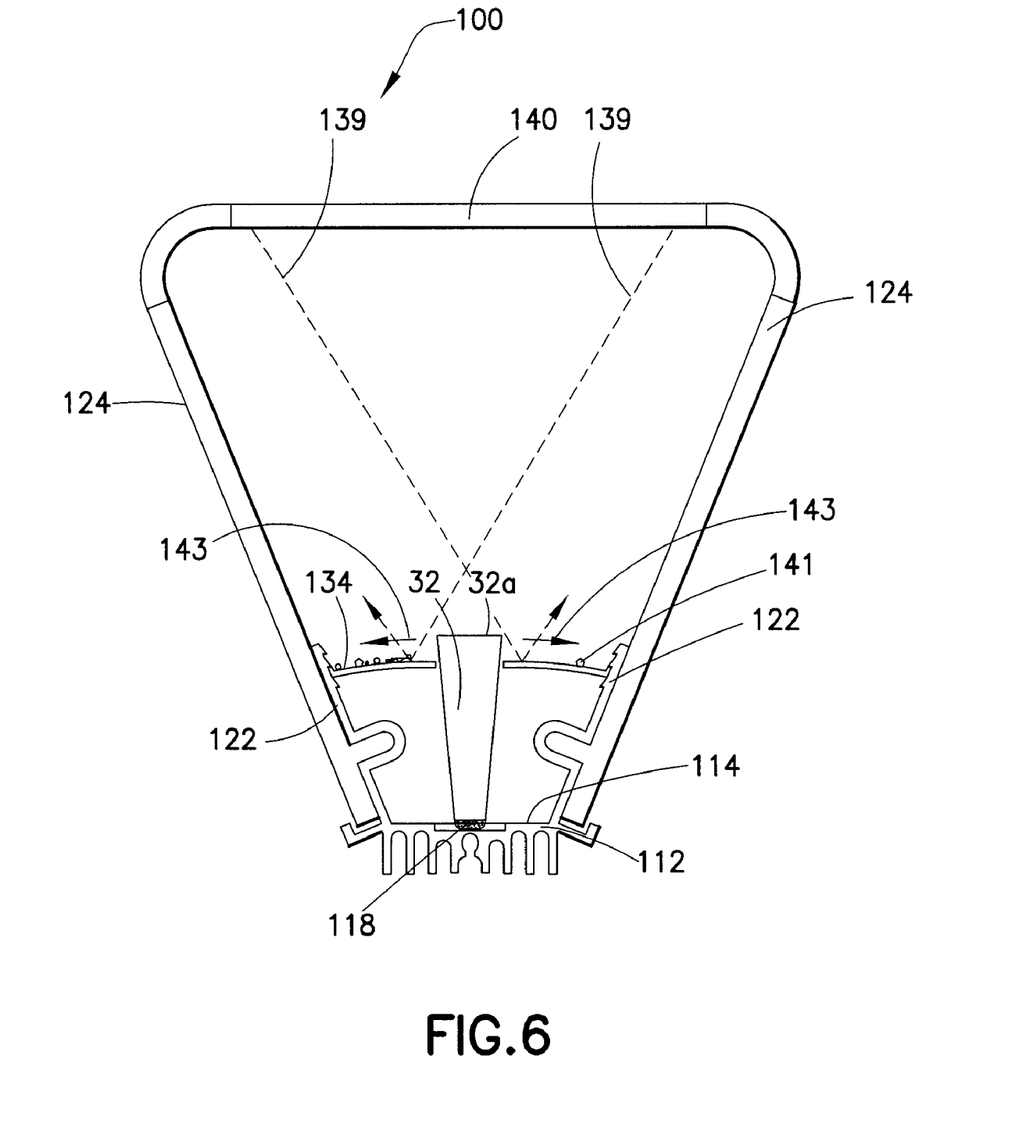
FIG. 6 is a section view of an embodiment of the photovoltaic module with the light shield bent in a convex shape.

In an alternate embodiment shown in FIG. 6, a photovoltaic module 100 is shown. Like reference numerals are offset by 100 to identify like elements to those described above with respect to the embodiment of FIGS. 1 and 2. The module 100 includes an opaque light shield 134 installed in a convex shape. The light shield 134 may be inserted into position between the sidewalls 122 with this pre-formed convex shape or may be inserted into position in a flat configuration and then bent upward into the convex shape. It will be appreciated that condensation 141 which may form on the light shield 134 will be guided by the light shield 134 in the direction of the arrows 143 toward the opposing sidewalls 122. Moreover, condensation that forms on the inside surface of the top panel 140 and/or sidewalls 124 will drip down the sidewalls toward the light shield 134. The convex shape of the light shield 134 cooperates with the sidewalls 122 to define guide channels for condensation that guides such condensation away from the central opening of the lights shields 134 and the photocells 118 and electrical conductors accessible thereunder and preferably toward one or more vented hydrophilic members (e.g., sponges and the like), which are preferably disposed at one or both ends of the module as described below with respect to FIGS. 8-10. As discussed above, the opaque light shield 134 will also block light 139 incident thereon from reaching the support surface 114 of the base 112. Thus, the light shield 134 will help to prevent shorts to the electrical conductors of the module and potentially reduce the heating of the photocells.

Figure 7A:
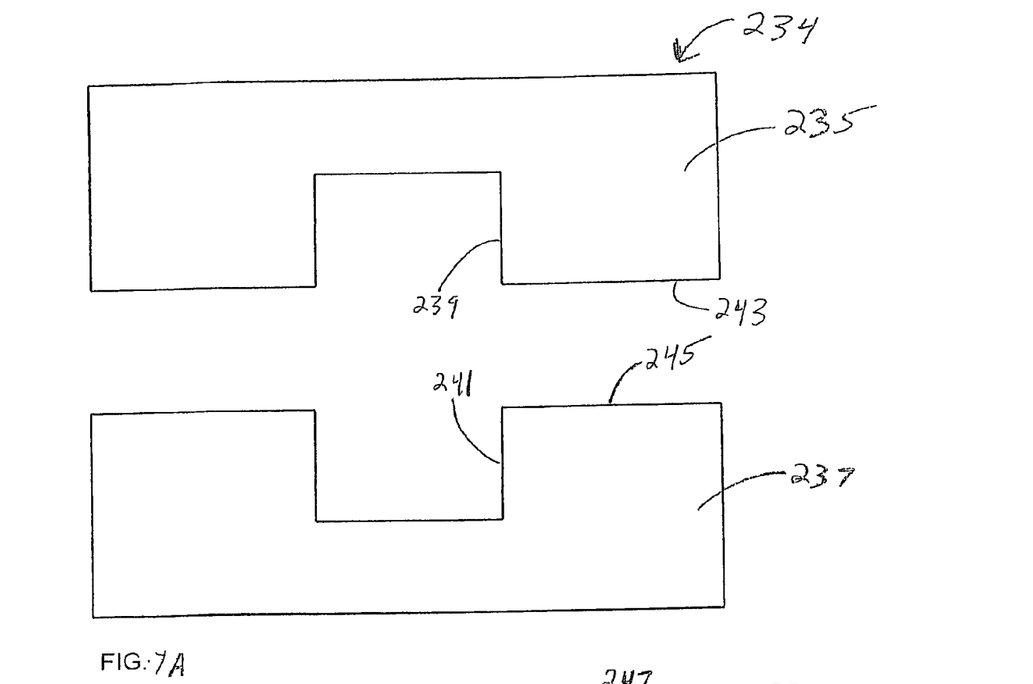
FIG. 7A is a top view of an embodiment of a light shield having two parts.
Figure 7B:
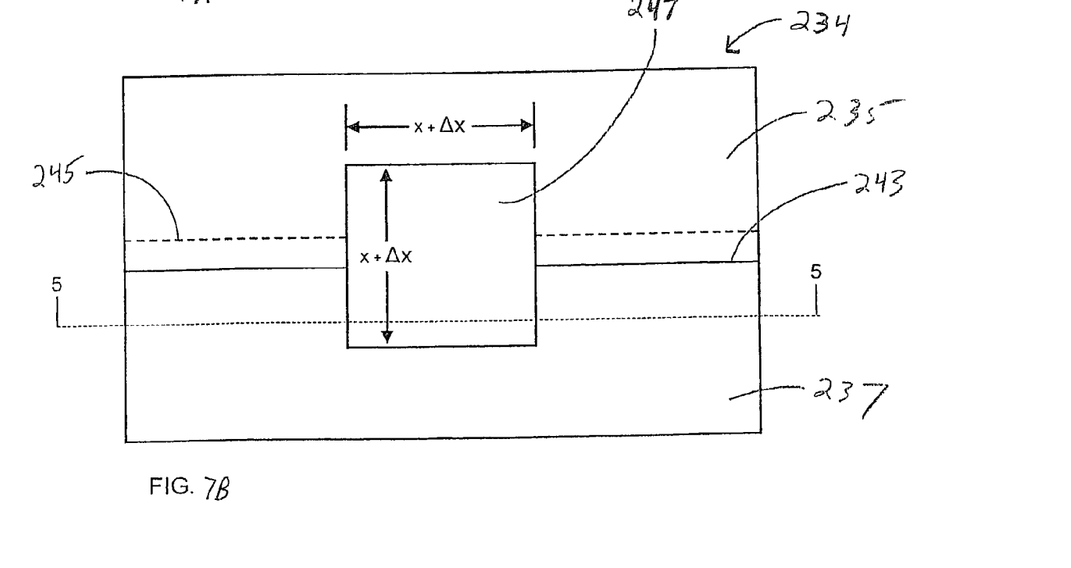
FIG. 7B is a top view of the light shield of FIG. 7A with the two parts overlapping each other.

Turning to FIGS. 7A-7B, an opaque light shield 234 is similar to the light shield 34 and the light shield 134 except that it consists of two parts 235, 237 designed to overlap each other as shown in FIG. 7B. The parts 235, 237 have centralized three sided slots 239, 241 and respective edges 243, 245. When assembled, the two parts 235, 237 of the light shield 234 overlap each other as shown in FIG. 7B with the edge 245 of the second part 237 disposed underneath the first part 235, parallel to the edge 243, and offset from the edge 243 such that the slots 239, 241 overlap each other to define a square cut-out region 247 having sides of dimension 'x'+'Δx', though other shapes of the parts 235, 237 and slots 239, 241 may be used depending on the shape of the secondary optical element as discussed above. The parts 235, 237 of the light-shield 234 may be installed and bent in the same manner as the light shield 34 and the light shield 134 between the sidewalls 122. It will be appreciated that the size of the cut-out region 247 may be varied by varying the degree to which the parts 235, 237 overlap each other. In addition, it will be appreciated that the parts 235, 237 of the light shield 234 may be assembled between the sidewalls 22 prior to or after installation of the secondary optical element 32.

Figure 8:
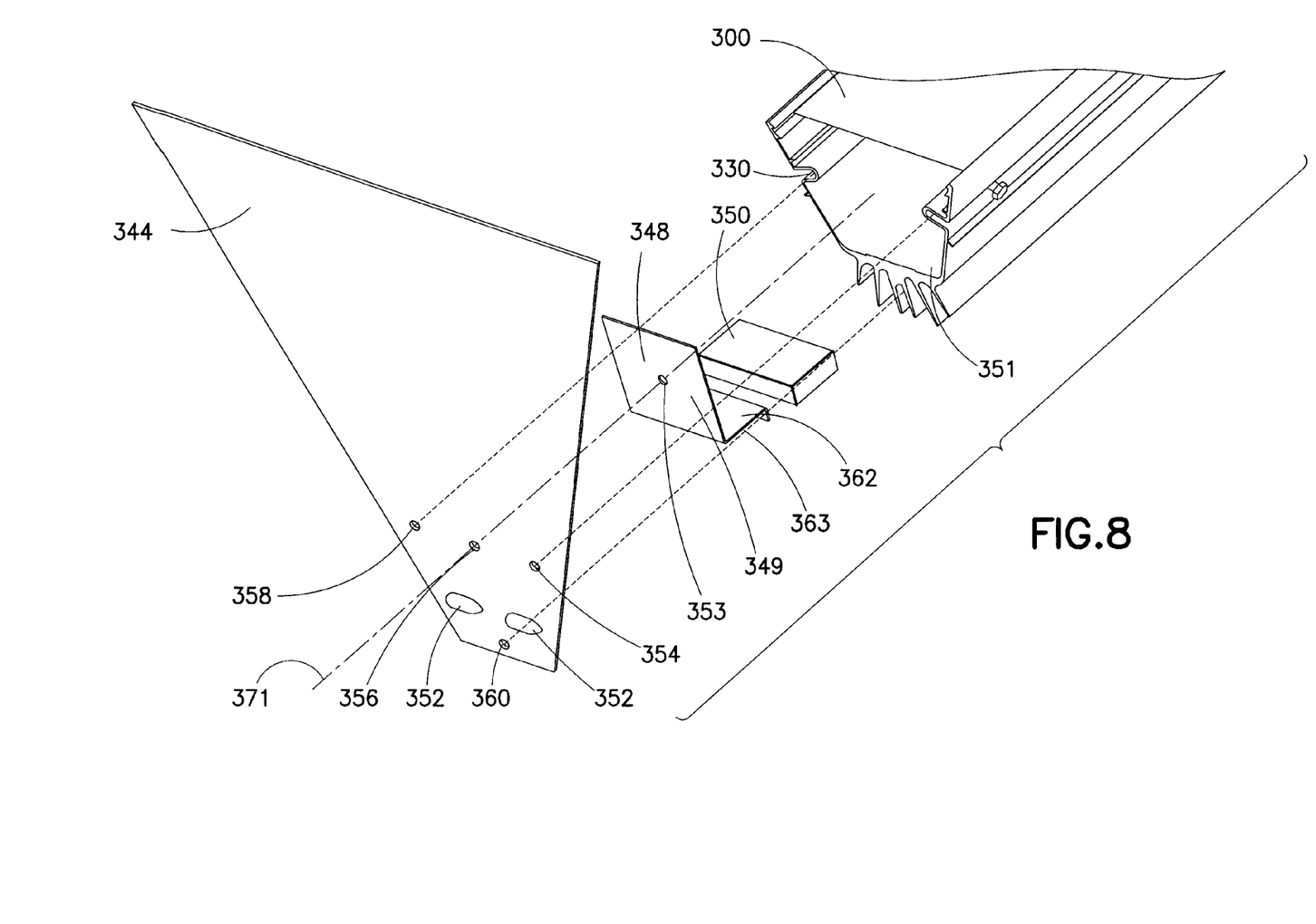
FIG. 8 is an exploded view of an endplate, bracket, and sponge at one vented end of the concentrated solar photovoltaic module of the present invention.
Figure 9:
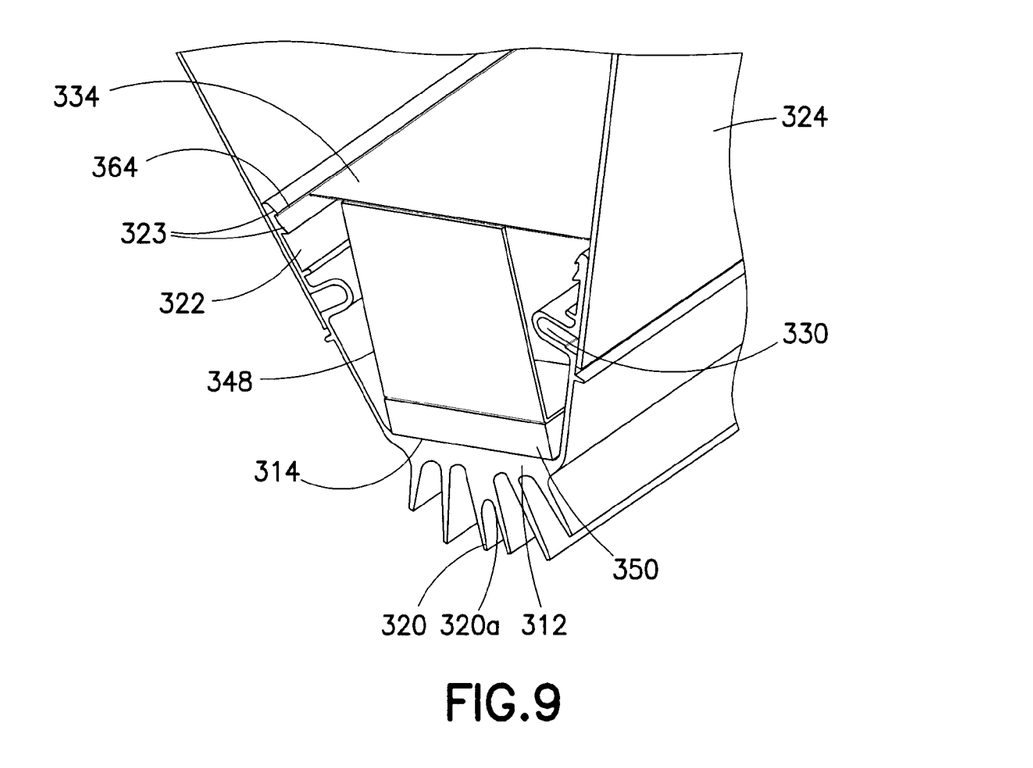
FIG. 9 is a perspective view of the bracket and sponge of FIG. 8 assembled at the vented end of the photovoltaic module.
Figure 10:
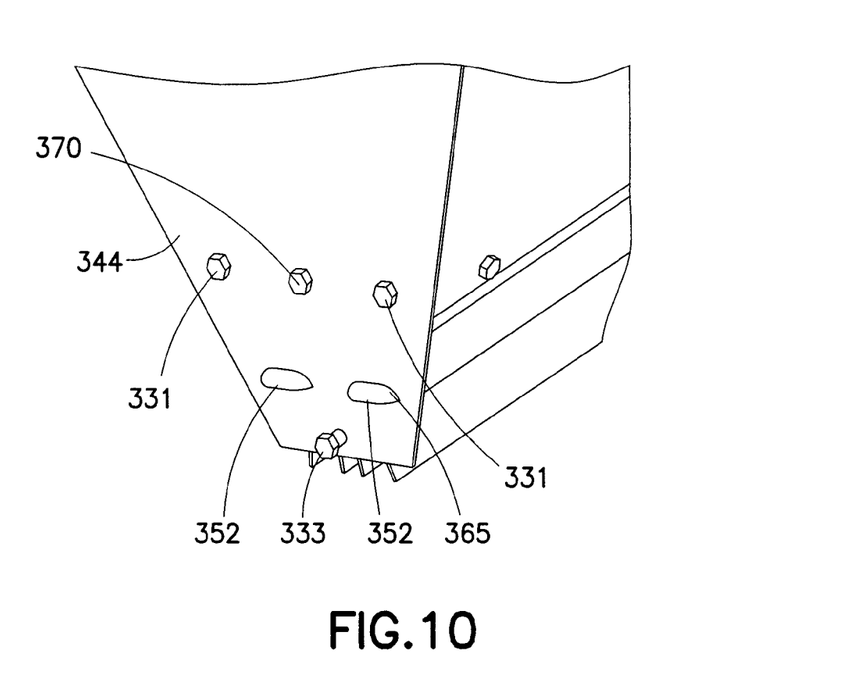
FIG. 10 is a perspective view of the vented end of the photovoltaic module with the endplate assembled.

Turning to FIGS. 8-10, a photovoltaic module 300 includes an end panel 344, a bracket 348, and a hydrophilic member 350 (e.g., a sponge) which are installable at a vented end 351 of the module 300. The end panel 344 includes at least one vent hole 352, as well as mounting holes 354, 356, 358, and 360. The mounting holes 354, 358 are aligned with same channels 330 defined by the sidewalls 322 for mounting the side panels 324. The channels 330 receive bolts or self tapping screws 331 (FIG. 10) which pass through the mounting holes 354, 358 and into the channels 330, fixing the end panel 344 to the base 312. Two of the cooling fins 320 are formed together define a channel 320a (FIG. 9) for receiving a bolt or self tapping screw 333 (FIG. 10) which passes through the mounting hole 360.

The bracket 348 has an upper face 349 oriented generally parallel with the end plate 344, a through-hole 353 which is generally aligned with the mounting hole 356 of the end panel 344, and a flange 362 which defines a channel 363 for receiving the sponge 350. The bracket 348 and sponge 350 are installed as shown in FIG. 9 with the sponge 350 situated inside the channel 363 just above the support surface 314 of the base 312. The bracket 348 is secured to the end panel 344 by a bolt or self tapping screw 370 (FIG. 10) which passes through the through-holes 356, 353 of the end panel 344 and bracket 348 respectively.

As shown in FIG. 9, the sidewalls 322 of the module 300 include a plurality of teeth 323 which hold the light shield 334 in place. The teeth 323 extend continuously in the longitudinal direction of the module 300 such that they define channels 364 which receive the outer edges of the light shield 334 and preferably extend parallel to the sidewalls 322. It will be appreciated that condensation which is guided toward the sidewalls 322 from the top of the light shield 334, either through tilting the entire module 300 or by virtue of the light shield 334 having a convex shape as discussed above, will be guided by the channels 364 toward the vented end 351 of the module 300. At the vented end 351, the guided condensation will contact the end panel 344 and flow down the end panel 344 toward the sponge 350. The sponge 350 will soak up the condensation guided thereto. The vent holes 352 in the end panel 344 provide ventilation for the sponge 250, thus allowing for release of moisture captured by the sponge 350 to the ambient. The vent holes 352 are provided with upper lids 365, which prevent rain from entering though the vent holes 352.

The end panel 344, bracket 348, and sponge 350 may be provided at opposite ends of the module 300 for increased ventilation and moisture absorption. As the bulk of condensation in photovoltaic modules typically occurs at night when the module cools down, the module 300 is preferably maintained at an angle toward one of the vented ends 351 at night so that any water droplets which form are guided thereto and absorbed by the sponge 350. The module 300 is also preferably maintained at an angle about the longitudinal axis 371 at night to guide water droplets which collect on the light shields 334 toward the sidewalls 322.

Figure 11:
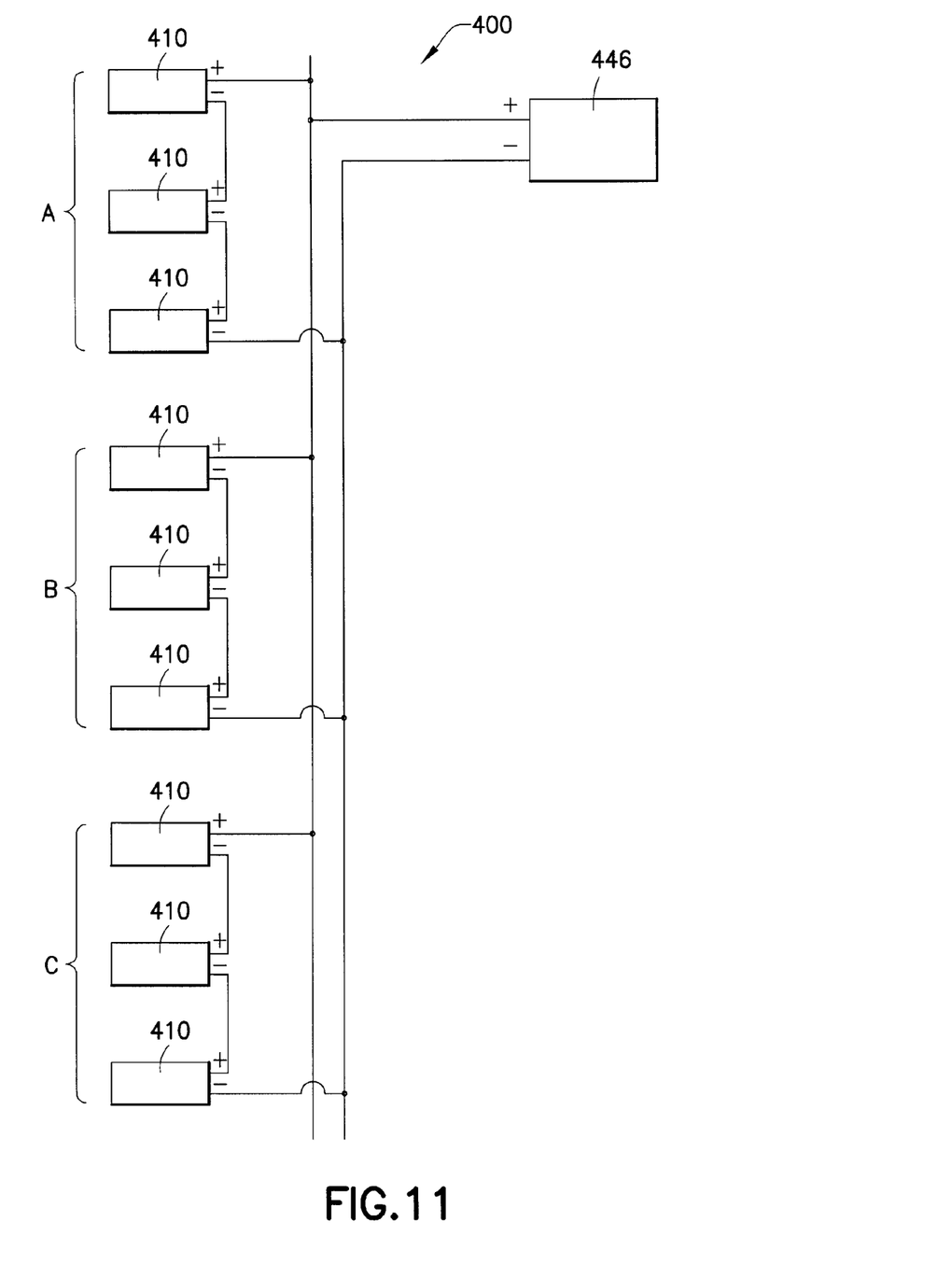
FIG. 11 is a schematic of an electrical power sink electronically coupled to a plurality of groups of the photovoltaic modules of FIG. 1.

Turning to FIG. 11, a system 400 includes an array of interconnected photovoltaic modules 410 arranged in groups A, B, and C. The modules 410 within each group are connected in series, and the groups A, B, C are connected in parallel with an electrical power sink 446. The electrical power sink 446 can be a DC/AC inverter and possibly a battery bank for energy storage. The DC/AC inverter converts the electrical energy outputted by the photovoltaic modules 410 (in the form of DC current) into AC current for energy supply applications. The battery bank stores the electrical energy outputted by the photovoltaic modules 410 for energy supply applications. Note that the electrical outputs of the photovoltaic modules 410 can be arranged in different configurations, such as a series configuration or hybrid parallel-series configuration as desired.

There have been described and illustrated herein several embodiments of a photovoltaic system, a module for housing and securing a plurality of photocells, secondary optical elements, and light shields, and methods of assembling a photovoltaic system. While particular embodiments of the invention have been described, it is not intended that the invention be limited thereto, as it is intended that the invention be as broad in scope as the art will allow and that the specification be read likewise. Thus, while particular materials, dimensions, shapes, fasteners, reflectors, lenses, etc. have been disclosed, it will be appreciated that other suitable substitutes can be used as well. While the embodiment of the present invention discloses a secondary optical element mounted directly on a corresponding photocell with an adhesive bond, it will be appreciated by those skilled in the art that the secondary optical element could be mounted above the photocell without any adhesive bonds. In addition, while a light shield mounted to the side walls of the base has been disclosed, it will be appreciated that the light shield could be mounted to the side panels instead. Moreover, while the preferred embodiment includes a plurality of light shields, it is contemplated that the module can include a single light shield with multiple cut-outs in the optical paths leading to the photocells of the module as described herein. Further, while the preferred embodiment discloses a single top panel containing concentrating lenses as part of the photovoltaic module, it will be appreciated that a plurality of top panels, each containing one or more concentrating lenses, may be integrated together as part of the photovoltaic module. It will also be appreciated that a tube containing a thermally conductive fluid may be secured to or integrated into the base member in order to scavenge the heat production of the photocells for use as a source of heat for additional applications. In addition, while the preferred embodiment discloses a prism in the shape of an inverted pyramid with a corresponding light shield having a cut-out shaped to receive it, it will be appreciated by those skilled in the art that other shapes and elements may be used for the secondary optical elements and the corresponding light shields. It will be appreciated by those skilled in the art that these and other modifications could be made to the provided invention without deviating from its spirit and scope as claimed.

What is claimed is:

1. A solar photovoltaic module comprising:
    a base member having a generally planar support surface and two side walls projecting from said support surface at obtuse angles with respect to said support surface, wherein, said support surface defines at least one recess for receiving a plurality of photovoltaic cells, and comprises a plurality of fins projecting downward from said support surface for diffusing heat away from said photovoltaic cells;
    two side panels mechanically supported by said two side walls of said base member;
    at least one top panel supported by said two side panels, said at least one top panel having an integral array of Fresnel lenses;
    an array of photovoltaic cells mounted to said at least one recess of said base member;
    an array of prisms corresponding and mounted to said array of photovoltaic cells, wherein each prism includes a top surface and defines a periphery; and a plurality of opaque light shields defining cut-out regions sized to receive portions of corresponding prisms, said cut-out regions allowing light directed from said concentrating lenses to enter said top surfaces of said prisms for propagation through said prisms to said photovoltaic cells, each opaque light shield extending between said side panels above said support surface of said base member, wherein said cut-out regions are defined by edges disposed below said top surface of the corresponding prism and extending around said periphery of the corresponding prism without contacting the corresponding prism, said plurality of opaque light shields blocking light incident thereon from reaching said support surface of said base member, wherein, said cut-out regions of said at least one opaque light shield are defined by edges, and said edges and said prisms define gaps therebetween.

2. A solar photovoltaic module according to claim 1, wherein:

said plurality of opaque light shields comprises a plurality of overlapping two-part members.

3. A solar photovoltaic module according to claim 2, wherein:

each given two-part member includes first and second members that extend parallel to one another between said two side panels of said module, said first and second members having cutout portions that define the cutouts corresponding to the prisms of the module.

4. A solar photovoltaic system, comprising:

at least one photovoltaic module of claim 1 and an electrical power sink electronically coupled to said at least one photovoltaic module.

5. A solar photovoltaic system according to claim 4, wherein:

said electrical power sink comprises at least one of a DC/AC inverter.

* * * * *